United States Patent
Kwean

(10) Patent No.: US 7,742,345 B2
(45) Date of Patent: Jun. 22, 2010

(54) DATA INPUT CIRCUIT OF SEMICONDUCTOR MEMORY APPARATUS AND METHOD OF INPUTTING THE DATA

(75) Inventor: Ki-Chang Kwean, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 146 days.

(21) Appl. No.: 11/822,099

(22) Filed: Jul. 2, 2007

(65) Prior Publication Data

US 2008/0062774 A1 Mar. 13, 2008

(30) Foreign Application Priority Data

Sep. 13, 2006 (KR) .................. 10-2006-0088735

(51) Int. Cl.
*G11C 7/10* (2006.01)
(52) U.S. Cl. ............. 365/189.05; 365/191; 365/194; 365/233.13; 365/233.18
(58) Field of Classification Search ........... 365/189.05, 365/191, 194, 233.13, 233.18
See application file for complete search history.

(56) References Cited

U.S. PATENT DOCUMENTS 5,912,899 A 6/1999 Kim et al.
6,192,429 B1 * 2/2001 Jeong et al. .................. 710/58
6,295,245 B1 * 9/2001 Tomita et al. ........... 365/189.16
7,061,941 B1 * 6/2006 Zheng ......................... 370/535
2003/0026138 A1 * 2/2003 Lee et al. ..................... 365/194

FOREIGN PATENT DOCUMENTS

| JP | 11144461 | 5/1999 |
|---|---|---|
| JP | 11238399 | 8/1999 |
| JP | 2001014845 | 1/2001 |
| JP | 2002246891 | 8/2002 |
| JP | 2004253072 | 9/2004 |
| KR | 10-1995-0027824 | 10/1995 |
| KR | 10-1997-0029883 | 6/1997 |
| KR | 1020010045220 | 6/2001 |
| KR | 1020060059229 | 6/2006 |

* cited by examiner

*Primary Examiner*—Tuan T Nguyen
*Assistant Examiner*—R Lance Reidlinger
(74) *Attorney, Agent, or Firm*—Venable LLP; Jeffri A. Kaminski

(57) ABSTRACT

A data input circuit for a semiconductor memory apparatus includes a write latency control unit configured to generate a buffer enable signal based on a low frequency operation mode signal, and a data input buffer configured to buffer input data in response to the buffer enable signal.

23 Claims, 3 Drawing Sheets

DATA INPUT CIRCUIT OF SEMICONDUCTOR MEMORY APPARATUS AND METHOD OF INPUTTING THE DATA

CROSS-REFERENCE TO RELATED PATENT APPLICATION

This application claims the benefit of Korean Patent Application No. 10-2006-0088735, filed on Sep. 13, 2006, in the Korean Intellectual Property Office, the disclosure of which is incorporated herein in its entirety by reference.

BACKGROUND OF THE INVENTION

1. Technical Field

The present invention relates to a data input circuit and method of inputting data, and in particular, to a data input circuit of a semiconductor memory apparatus and method of inputting the data that is capable of reducing power consumption.

2. Related Art

Generally, a semiconductor memory apparatus includes a write latency control unit to generate a buffer enable signal. The semiconductor memory apparatus further includes a data input buffer to perform a buffering operation on input data depending on whether the buffer enable signal is enabled or not.

When a write command is input, data is input after predetermined cycles of a clock. In this case, a write latency indicates the number of cycles of the clock when the data is input. Generally, the length of the write latency is 1 to 7. A write latency signal is allocated beforehand for each of the lengths of the write latency.

The write latency control unit enables a low enable signal when a row active command is input, and disables the low enable signal when a row precharge command is input. Further, the write latency control unit enables the write enable signal when the write command is input, and disables the write enable signal when a burst end signal is input. The row enable signal or the write enable signal is used as the buffer enable signal.

When the length of the write latency is short (for example, 1 to 3), if the write latency control unit enables the buffer enable signal according to input of the write command, an undesirable effect such as the delay of input of the data at the data input buffer occurs. Thus, erroneous operation such as a timing error between the buffer enable signal and the input data may occur. Therefore, when the length of the write latency is short, the row enable signal is output as the buffer enable signal, in order to increase a timing margin between the buffer enable signal and the input data because the row active command is enabled earlier than the write command.

In contrast, when the length of the write latency is long (for example, 4 to 7), the write enable signal is output as the buffer enable signal. Since an enable period of the row enable signal is longer than an enable period of the write enable signal, it may reduce the power consumption.

Such a data input circuit for a semiconductor memory apparatus is designed to accommodate the use of a high frequency clock. The semiconductor memory apparatus uses a DLL (Delay Locked Loop) off mode in order to reduce the power consumption. When the semiconductor memory apparatus enters the DLL off mode, a DLL circuit does not operate and an external clock having a low frequency is transmitted to internal individual regions.

When the semiconductor memory apparatus uses the low frequency clock, that is, the same as the DLL off mode, the enable period of the row enable signal becomes longer as the period of the clock is lengthened. In this case, if the write latency is short, the enable period of the buffer enable signal becomes longer, which increases the power consumption. However, currently, there is no technique for reducing the unnecessary power consumption, resulting in continuous current consumption.

SUMMARY OF THE INVENTION

Embodiments of the present invention provide a data input circuit of a semiconductor memory apparatus and method of inputting the data that is capable of reducing power consumption.

An embodiment of the present invention provides a data input circuit for a semiconductor memory apparatus including: a write latency control unit configured to generate a buffer enable signal based on a low frequency operation mode signal; and a data input buffer configured to buffer input data in response to the buffer enable signal.

Another embodiment of the present invention provides a data input circuit for a semiconductor memory apparatus including: a write latency control unit configured to generate a buffer enable signal in accordance with a write latency in a high frequency operation mode, and to generate the buffer enable signal regardless of the write latency in a low frequency operation mode; and a data input buffer configured to buffer input data in response to the buffer enable signal.

Still another embodiment of the present invention provides a data input method for a semiconductor memory apparatus including: generating a row enable signal from a row active command and a row precharge command and a write enable signal from a write command and a burst end signal; passing the row enable signal and the write enable signal in a high frequency operation mode, and passing only the write enable signal in a low frequency operation mode; outputting the passed row enable signal or the passed write enable signal as a buffer enable signal when a write latency is shorter than a predetermined length, and outputting the passed write enable signal as the buffer enable signal when the write latency is longer than the predetermined length; and buffering input data using the buffer enable signal.

DESCRIPTION OF EXEMPLARY EMBODIMENT

Hereinafter, a preferred embodiment of the present invention will be described in detail with reference to accompanying drawings.

The embodiment is an example in which a length of the write latency is assigned as a value of 1 to 7 and a DLL off signal is used as a low frequency operation mode signal.

Figure 1:
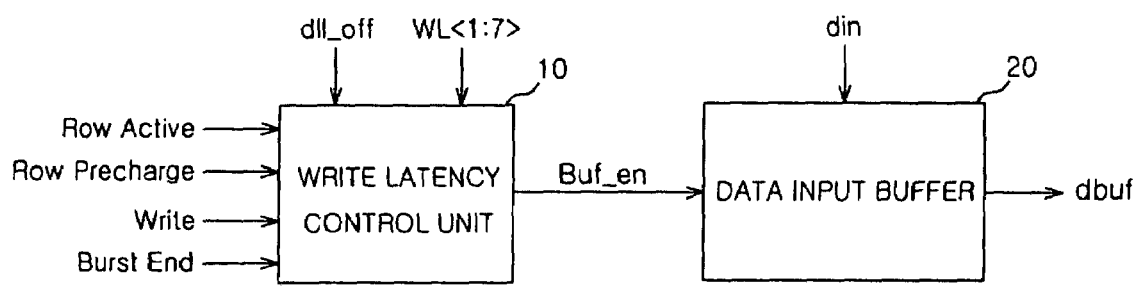
FIG. 1 is a block diagram illustrating a structure of a data input circuit for a semiconductor memory apparatus according to an embodiment of the present invention.

Referring to FIG. 1, the data input circuit includes a write latency control unit 10 and a data input buffer 20.

The write latency control unit 10 generates a buffer enable signal Buf_en using a row active command Row Active, a row precharge command Row Precharge, a write command Write, and a burst end signal Burst End, in response to a DLL off signal dll_off and first to seventh write latency signals WL<1:7>. The write latency control unit 10 generates a row enable signal using the row active command Row Active and the row precharge command Row Precharge. Further, the write latency control unit 10 generates a write enable signal using the write command Write and the burst end signal Burst End. The row enable signal and the write enable signal are used as the buffer enable signal Buf_en.

If the DLL off signal dll_off is disabled, that is, in the high frequency operation mode, the write latency control unit 10 outputs the write enable signal as the buffer enable signal Buf_en when one of the fourth to seventh write latency signals WL<4:7> is enabled. Further, the write latency control unit 10 outputs the row enable signal as the buffer enable signal Buf_en when one of the first to third write latency signals WL<1:3> is enabled.

In contrast, if the DLL off signal dll_off is enabled, that is, in the low frequency operation mode, the write latency control unit 10 outputs the write enable signal as the buffer enable signal Buf_en regardless of whether any of the first to seventh write latency signals WL<1:7> is enabled.

The data input buffer 20 buffers input data din in response to the input of the buffer enable signal Buf_en to output buffering data dbuf.

Figure 2:
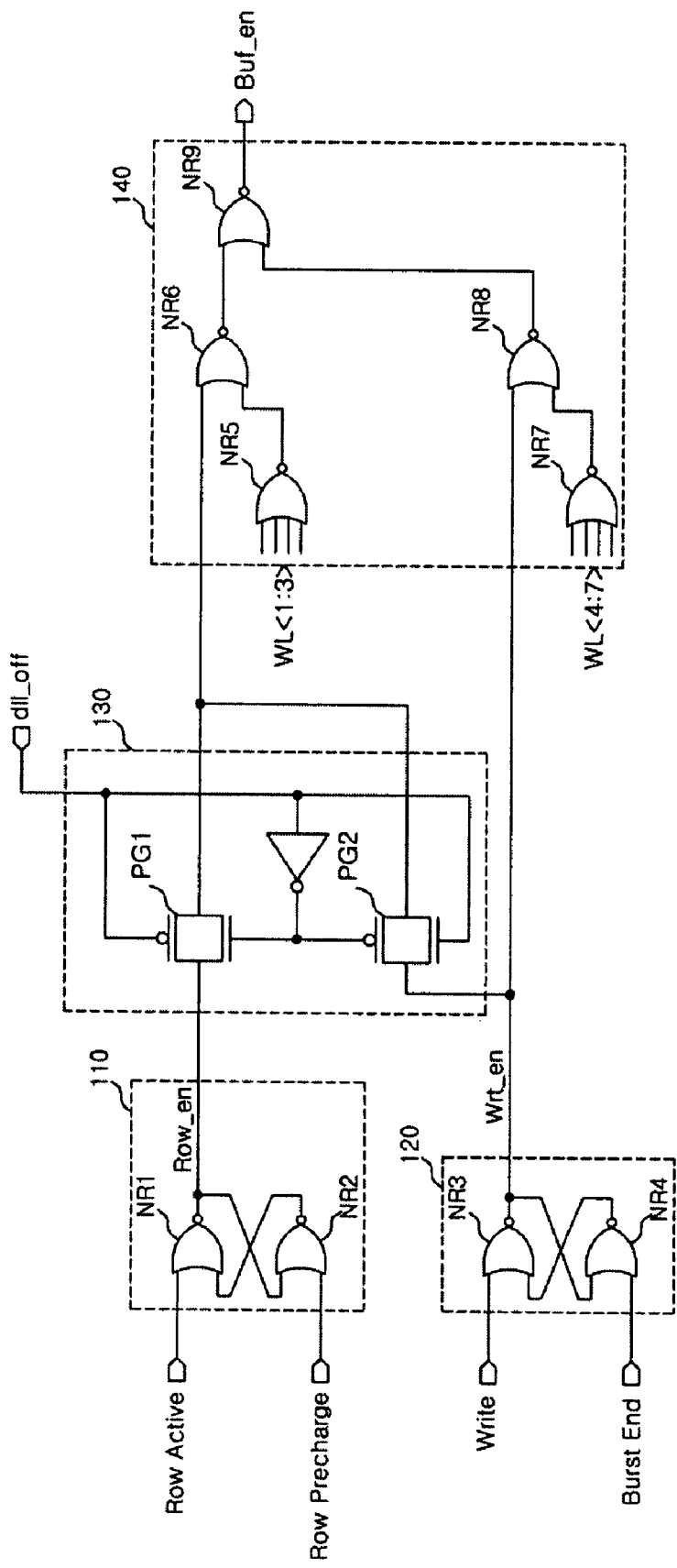
FIG. 2 is a diagram illustrating a structure of a write latency control unit shown in FIG. 1.

FIG. 2 is a diagram illustrating a structure of the write latency control unit 10 shown in FIG. 1.

The write latency control unit 10 includes a low enable signal generating section 110, a write enable signal generating section 120, an operation mode controlling section 130, and a buffer enable signal generating section 140.

The row enable signal generating section 110 generates the row enable signal Row_en in response to the row active command Row Active and the row precharge command Row Precharge. The row enable signal generating section 110 is configured by a flip-flop that has NOR gates NR1 and NR2. The NOR gate NR1 receives the row active command Row Active and the NOR gate NR2 receives the row precharge command Row Precharge, respectively.

The write enable signal generating section 120 generates the write enable signal Wrt_en in response to the write command Write and the burst end signal Burst End. The write enable signal generating section 120 is configured by a flip-flop that has NOR gates NR3 and NR4. The NOR gate NR3 receives the write command Write and the NOR gate NR4 receives the burst end signal Burst End, respectively.

The operation mode controlling section 130 selectively outputs the row enable signal Row_en or the write enable signal Wrt_en depending on whether the DLL off signal dll_off is enabled or not. The operation mode controlling section 130 includes two pass gates PG1 and PG2 that are selectively turned on depending on whether the DLL off signal dll_off is enabled or not.

The buffer enable signal generating section 140 composes a signal transmitted from the operation mode controlling section 130, the first to third write latency signals WL<1:3>, the write enable signal Wrt_en, and the fourth to seventh write latency signals WL<4:7> to generate the buffer enable signal Buf_en. The buffer enable signal generating section 140 includes a fifth NOR gate NR5 that receives the first to third write latency signals WL<1:3>, a sixth NOR gate NR6 that receives an output signal of the operation mode controlling section 130 and an output signal of the fifth NOR gate NR5, a seventh NOR gate NR7 that receives the fourth to seventh write latency signals WL<4:7>, an eighth NOR gate NR8 that receives the write enable signal Wrt_en and an output signal of the seventh NOR gate NR7, and a ninth NOR gate NR9 that receives an output signal of the sixth NOR gate NR6 and an output signal of the eighth NOR gate NR8, to output the buffer enable signal Buf_en.

When the row active command Row Active is input to the row enable signal generating section 110, the row enable signal Row_en is enabled. Thereafter, when the row precharge command Row Precharge is input to the row enable signal generating section 110, the row enable signal Row_en is disabled.

When the write command Write is input to the write enable signal generating section 120, the write enable signal Wrt_en is enabled. Thereafter, when the burst end signal Burst End is input to the write enable signal generating section 120, the write enable signal Wrt_en is disabled.

If the DLL off signal dll_off is disabled, the first pass gate PG1 is turned on, and the second pass gate PG2 is turned off in the operation mode controlling section 130. Accordingly, the row enable signal Row_en is transmitted to the sixth NOR gate NR6 of the buffer enable signal generating section 140, and the write enable signal Wrt_en is transmitted to the eighth NOR gate NR8. If one of the first to third write latency signals WL<1:3> is enabled, the row enable signal Row_en is output as the buffer enable signal Buf_en. Meanwhile, if one of the fourth to seventh write latency signals WL<4:7> is enabled, the write enable signal Wrt_en is output as the buffer enable signal Buf_en.

In contrast, in a state where the DLL off signal dll_off is enabled, the first pass gate PG1 is turned off, and the second pass gate PG2 is turned on in the operation mode controlling section 130. Accordingly, the write enable signal Wrt_en is transmitted to the sixth NOR gate NR6 and the eighth NOR gate NR8 of the buffer enable signal generating section 140. In this case, the write enable signal Wrt_en is output as the buffer enable signal Buf_en regardless of the first to seventh write latency signals WL<1:7>.

Figure 3:
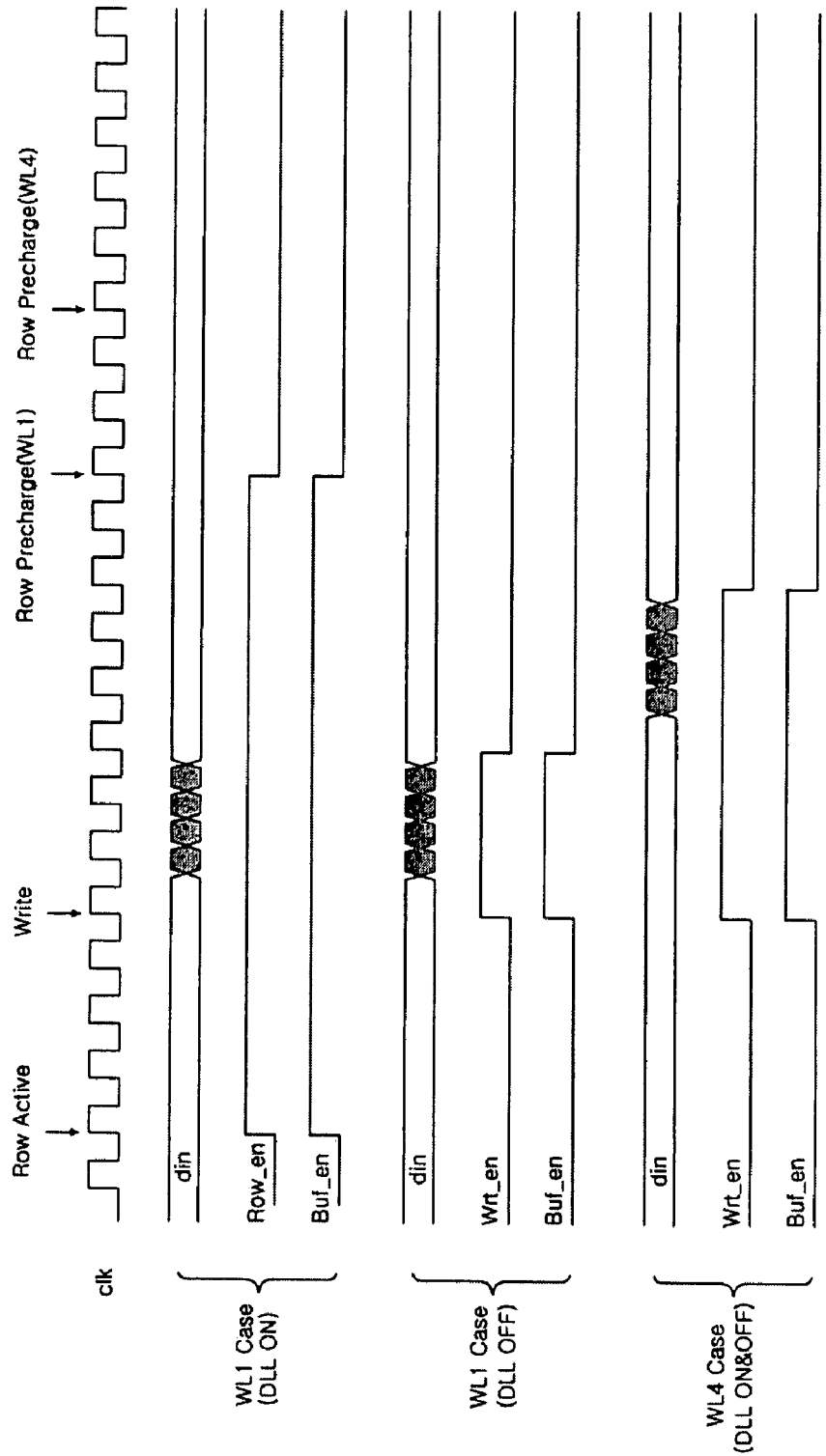
FIG. 3 is a timing diagram illustrating an operation of the input circuit for a semiconductor memory apparatus according to an embodiment of the invention.

FIG. 3 is a timing diagram illustrating the operation of the data input circuit for a semiconductor memory apparatus according to an embodiment of the present invention.

Referring to FIG. 3, enable periods of the row enable signal Row_en and the buffer enable signal Buf_en when the write latency is 1 (WL 1 Case) are illustrated. In this case, the case when the write latency is 1 (WL 1 Case) is divided into a DLL off mode DLL OFF and a DLL on mode DLL ON. Further, in the drawing, enable periods of the row enable signal Row_en and the buffer enable signal Buf_en when the write latency is 4 (WL 4 Case) are illustrated. Here, the write latencies of 1 and 4 are examples of a short write latency and a long write latency, respectively. The write command is input after four cycles of the clock clk when the row active command Row Active is input.

In FIG. 3, an input timing of the row precharge command Row Precharge when the length of the write latency is 1 (WL 1 Case) and an input timing of the row precharge command Row Precharge when the length of the write latency is 4 (WL 4 Case) are shown. When the write latency is 1, the input data din starts to be input after one cycle of the clock clk from the input timing of the write command Write, and when the write latency is 4, the input data din starts to be input after 4 cycles of the clock clk from the input timing of the write command Write. Here, it is considered that the burst length Burst Length is 4.

The row enable signal Row_en is enabled when the row active command Row Active is input and is disabled when the row precharge command Row Precharge is input. Further, the write enable signal Wrt_en is enabled when the write command Write is input and is disabled when the burst end signal is enabled. Even though not shown, the burst end signal is a signal for allowing the write enable signal to be disabled in consideration of the burst length of the input data din. Referring to the drawing, it is understood that the enable period of the row enable signal Row_en is longer than the enable period of the write enable signal Wrt_en.

When the write latency is 1 (WL 1 Case) in the DLL on mode DLL ON, the buffer enable signal Buf_en is generated from the row enable signal Row_en. Further, when the write latency is 4 (WL 4 Case), the buffer enable signal is generated from the write enable signal Wrt_en regardless of the DLL on mode DLL ON or the DLL off mode DLL OFF, which is the same as in the related art.

However, when the write latency is 1 (WL 1 Case), in the DLL off mode DLL OFF, the buffer enable signal Buf_en is generated from the write enable signal Wrt_en.

That is, according to the data input circuit for the semiconductor memory apparatus according to an embodiment of the present invention, if the semiconductor memory apparatus uses a low frequency clock, such as in the DLL off mode, and the write latency is short, the enable period of the buffer enable signal becomes longer as the enable period of the row enable signal becomes longer, which reduces the power consumption. Further, even when erroneous operation such as the unwanted data input delay occurs in the data input buffer due to the short write latency, the clock cycle has a sufficient length. Therefore, there is no possibility of erroneous operation such as the timing-off between the buffer enable signal and the input data. As a result, it is possible to reduce unnecessary power consumption in the buffer enable signal generating operation for buffering the input data.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The data input circuit and method for a semiconductor memory apparatus according to an embodiment of the present invention can selectively output the row enable signal or the write enable signal as the buffer enable signal according to the clock frequency when the write latency is shorter than a predetermined reference length to reduce power consumption.

What is claimed is:

1. A data input circuit for a semiconductor memory apparatus, comprising:
   a write latency control unit configured to generate a buffer enable signal, and to vary an enable period of the buffer enable signal based on a low frequency operation mode signal when a length of a write latency is shorter than a predetermined length; and
   a data input buffer configured to buffer input data in response to the buffer enable signal.

2. The data input circuit of claim 1, wherein the low frequency operation mode signal is a DLL off signal.

3. The data input circuit of claim 1, wherein the write latency control unit is configured to generate a write enable signal from a write command and a burst end signal, and output the write enable signal as the buffer enable signal if the length of the write latency is longer than the predetermined length when the low frequency operation mode signal is disabled.

4. The data input circuit of claim 3, wherein the write latency control unit is configured to further generate a row enable signal from a row active command and a row precharge command, output the write enable signal as the buffer enable signal regardless of the length of the write latency when the low frequency operation mode signal is enabled, and output the row enable signal as the buffer enable signal if the length of the write latency is shorter than the predetermined length when the low frequency operation mode signal is disabled.

5. The data input circuit of claim 4, wherein the write latency control unit comprises:
   a row enable signal generating section configured to generate the row enable signal in response to the row active command and the row precharge command;
   a write enable signal generating section configured to generate the write enable signal in response to the write command and the burst end signal;
   an operation mode controlling section configured to selectively output as an output signal the row enable signal or the write enable signal depending on whether the low frequency operation mode signal is enabled or not; and
   a buffer enable signal generating section configured to process the output signal transmitted from the operation mode controlling section, the write enable signal, and a plurality of latency signals to generate the buffer enable signal.

6. The data input circuit of claim 5, wherein the row enable signal generating section comprises a flip-flop configured to enable the row enable signal when the row active command is input to the flip-flop and to disable the row enable signal when the row precharge command is input to the flip-flop.

7. The data input circuit of claim 5, wherein the write enable signal generating section comprises a flip-flop configured to enable the write enable signal when the write command is input to the flip-flop and to disable the write enable signal when the burst end signal is input to the flip-flop.

8. The data input circuit of claim 5, wherein the operation mode controlling section comprises a switching element configured to selectively output as the output signal the row enable signal or the write enable signal depending on whether the low frequency operation mode signal is enabled or not.

9. The data input circuit of claim 5, wherein buffer enable signal generating section is configured to process the output signal from the operation mode controlling section with a write latency signal having a predetermined length or shorter and to process the write enable signal with a write latency signal having the predetermined length or longer to generate the buffer enable signal.

10. The data input circuit of claim 9, wherein the buffer enable signal generating section comprises:
   a first NOR gate configured to receive as input the write latency signal having the predetermined length or shorter and to provide an output signal;
   a second NOR gate configured to receive as input the output signal from the operation mode controlling section and the output signal of the first NOR gate and to provide an output signal;
   a third NOR gate configured to receive as input the write latency signal having the predetermined length or longer and to provide an output signal;
   a fourth NOR gate configured to receive the write enable signal and the output signal of the third NOR gate and to provide an output signal; and a fifth NOR gate configured to receive as input the output signal of the second NOR gate and the output signal of the fourth NOR gate and to output the buffer enable signal.

11. A data input circuit for a semiconductor memory apparatus comprising:
a write latency control unit configured to generate a buffer enable signal in accordance with a write latency in a high frequency operation mode, and to generate the buffer enable signal regardless of the write latency in a low frequency operation mode; and
a data input buffer configured to buffer input data in response to the buffer enable signals wherein the write latency control unit is configured to generate a write enable signal from a write command and a burst end signal, and output the write enable signal as the buffer enable signal regardless of a length of the write latency in the low frequency mode and is configured to further generate a row enable signal from a row active command and a row precharge command, output the row enable signal as the buffer enable signal if the length of the write latency is shorter than a predetermined length in the high frequency operation mode, and output the write enable signal as the buffer enable signal if the length of the write latency is longer than the predetermined length in the high frequency operation mode.

12. The data input circuit of claim 11, wherein the high frequency operation mode and the low frequency operation mode are enabled depending on whether a DLL off signal is enabled or not.

13. The data input circuit of claim 11, wherein the write latency control unit comprises:
a row enable signal generating section configured to generate the row enable signal in response to the row active command and the row precharge command;
a write enable signal generating section configured to generate the write enable signal in response to the write command and the burst end signal;
an operation mode controlling section configured to selectively output as an output signal the row enable signal or the write enable signal depending on whether it is in the high frequency operation mode or the low frequency operation mode; and
a buffer enable signal generating section configured to process the output signal transmitted from the operation mode controlling section, the write enable signal, and a plurality of latency signals to generate the buffer enable signal.

14. The data input circuit of claim 13, wherein the row enable signal generating section comprises a flip-flop configured to enable the row enable signal when the row active command is input to the flip-flop and to disable the row enable signal when the row precharge command is input to the flip-flop.

15. The data input circuit of claim 13, wherein the write enable signal generating section comprises a flip-flop configured to enable the write enable signal when the write command is input to the flip-flop and to disable the write enable signal when the burst end signal is input to the flip-flop.

16. The data input circuit of claim 13, wherein the operation mode controlling section comprises a switching element configured to selectively output as the output signal the row enable signal or the write enable signal depending on whether it is in the high frequency operation mode or the low frequency operation mode.

17. The data input circuit of claim 13, wherein buffer enable signal generating section is configured to process the output signal from the operation mode controlling section with a write latency signal having a predetermined length or shorter and to process the write enable signal with a write latency signal having a predetermined length or longer to generate the buffer enable signal.

18. The data input circuit of claim 17, wherein the buffer enable signal generator includes:
a first NOR gate configured to receive as input the write latency signal having the predetermined length or shorter and to provide an output signal;
a second NOR gate configured to receive as input the output signal from the operation mode controlling section and the output signal of the first NOR gate and to provide an output signal;
a third NOR gate configured to receive as input the write latency signal having the predetermined length or longer and to provide an output signal;
a fourth NOR gate configured to receive the write enable signal and the output signal of the third NOR gate and to provide an output signal; and
a fifth NOR gate configured to receive as input the output signal of the second NOR gate and the output signal of the fourth NOR gate and to output the buffer enable signal.

19. A data input method of a semiconductor memory apparatus comprising:
generating a row enable signal from a row active command and a row precharge command and a write enable signal from a write command and a burst end signal;
passing the row enable signal and the write enable signal in a high frequency operation mode, and passing only the write enable signal in a low frequency operation mode;
outputting the passed row enable signal or the passed write enable signal as a buffer enable signal when a write latency is shorter than a predetermined length, and outputting the passed write enable signal as the buffer enable signal when the write latency is longer than the predetermined length; and
buffering input data using the buffer enable signal.

20. The data input method of claim 19, wherein in the passing of the row enable signal or the write enable signal, the high frequency operation mode or the low frequency mode is enabled depending on whether a DLL off signal is enabled or not.

21. The data input method of claim 19, wherein the generating of the row enable signal and the write enable signal comprises allowing the row enable signal to be enabled when the row active command is input and to be disabled when the row precharge command is input.

22. The data input method of claim 19, wherein the generating of the row enable signal and the write enable signal comprises allowing the write enable signal to be enabled when the write command is input and to be disabled when the burst end signal is input.

23. The data input method of claim 19, wherein the outputting of the buffer enable signal comprises processing the row enable signal or the write enable signal with a write latency signal having a predetermined length or shorter, and processing the write enable signal with a write latency signal having a predetermined length or longer.

* * * * *